DIMENSIONALLY STABLE ELECTRICAL CIRCUIT LAMINATES

Filed June 8, 1966

INVENTOR
NORMAN J. COTTER

BY Edwin Tocker

ATTORNEY

United States Patent Office 3,532,570

Patented Oct. 6, 1970

3,532,570
DIMENSIONALLY STABLE ELECTRICAL CIRCUIT LAMINATES

Norman J. Cotter, Springfield, Pa., assignor to E. I. du Pont de Nemours and Company, Wilmington, Del., a corporation of Delaware Filed June 8, 1966, Ser. No. 556,079
Int. Cl. H01b 13/10; B29c 3/02; C09j 5/00
U.S. Cl. 156—52 12 Claims

ABSTRACT OF THE DISCLOSURE

A dimensionally stable laminate of dielectric thermoplastic polymer film and electrically conductive material, such as a plurality of parallel wires, is made by bringing the film and conductive material together in superimposed relationship, heating the film and conductive material so that the film wets the conductive material, forcing the film into contact with the conductive material during the heating, laterally confining the film during the forcing step, and while cooling the resultant composite structure, maintaining the lateral confinement of the film and maintaining pressure thereon so as to prevent differential shrinkage between the film and the conductive material.

This invention relates to a process for making dimensionally stable laminates of dielectric thermoplastic polymer film and electrically conductive material, which are useful in electrical circuity.

Thermoplastic polymer film is generally useful for electrically insulation purposes because of its dielectric character. The film is adhered to electrically conductive material such as printed circuit foil or wire by the application of heat and pressure. Upon heating, the film tends to expand more than the conductive material and at laminating temperatures to flow laterally. In the case of when the conductive material is wires, this lateral flow causes sideways displacement or "swimming" of the wires, wihch in use can give rise to an electrical short-circuit. Upon cooling, the film shrinks more than the electrically conductive material adhered thereto. In the case of when the conductive material is foil, this differential shrinkage induces stresses in the film. The induced stresses in the film are partially relieved when the resultant laminate is further processed by conventional selective etching away of unneeded conductive material with a resulting movement of the resist-treated residual conductive material. If the resultant etched laminate is re-exposed to heat and pressure so as to be laminated to a cover film or a plurality of other laminates, further stress relief and in addition, the differential expansion occurs to cause "swimming" of the etched conductive material to the extent that precision alignment of the like circuit elements between circuits is destroyed.

A process has now been discovered for making dimensionally stable laminates of dielectric thermoplastic polymer film and electrically conductive material. In one embodiment of this discovery, the film and the conductive material are brought together in superimposed relationship and then heated to a temperature at which the film wets the conductive material, applying pressure to insure intimate contact between the heated film and conductive material, laterally confining the film during said heating, cooling the resultant laminate, applying pressure to the cooling laminate to prevent differential shrinkage of the film and conductive material, laterally confining the cooling laminate to prevent lateral flow of said film during the second mentioned pressure application step, and obtaining as a result thereof a dimensionally stable laminate. This process can be carried out on many forms of laminates such as on a single thickness of film and conductive material, a laminate made from such single thicknesses and a cover-coating film, or a stack of laminates made from single thicknesses of film and conductive material in alternating layers.

These and other embodiments of the present discovery will be described in detail hereinafter with reference to the accompanying drawings in which.

Figures 1, 2, 3, 4, 5, 6, 7, 8, 9:
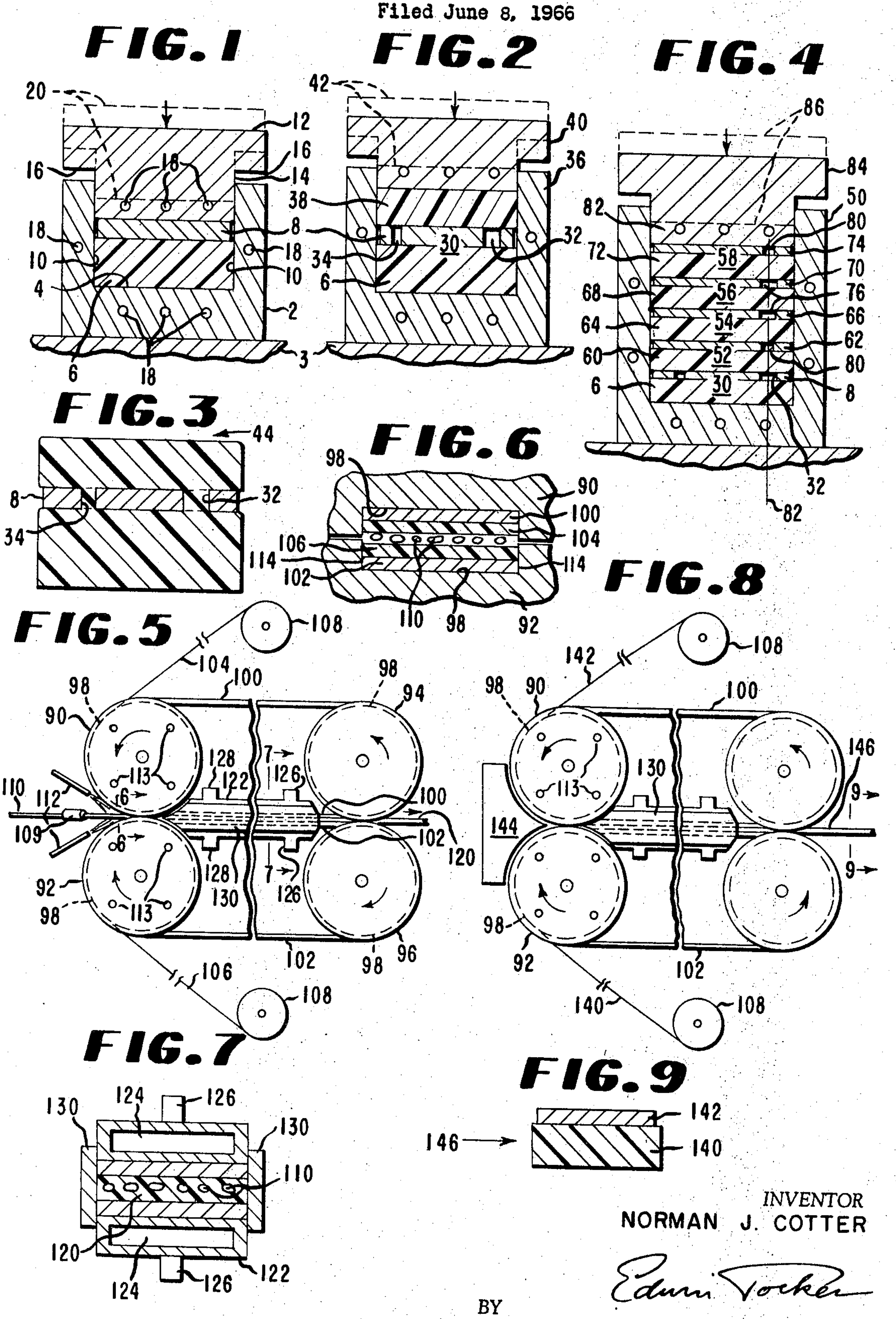
FIG. 1 shows in cross-section a schematic side elevation of apparatus suitable for carrying out one embodiment of the process of this invention.
FIG. 2 shows in cross section and side elevation apparatus similar to that of FIG. 1 for carrying out another embodiment of the process of this invention.
FIG. 3 shows a cross-section of the laminate made in the apparatus of FIG. 2.
FIG. 4 shows apparatus similar to that of FIG. 1 for carrying out still another embodiment of the process of this invention.
FIG. 5 shows in schematic side elevation different apparatus suitable for carrying out a still further embodiment of the process of the present invention.
FIG. 6 is a partial view of a section taken along line 6—6 of FIG. 5.
FIG. 7 is a partial view of a cross-section taken along line 7—7 of FIG. 5.
FIG. 8 shows apparatus similar to that of FIG. 5 for carrying out yet another embodiment of the process of this invention.
FIG. 9 shows a cross-section taken along line 9—9 of FIG. 8 of a laminate made according to the process of this invention.

Referring to the drawings, FIG. 1 shows a mold 2 supported on a surface 3 and having a cavity 4 which is rectangular in horizontal cross-section and is closed on all sides except the top. Dielectric thermoplastic polymer in the form of a film 6 or equivalent sheet-like shape, is brought together in superimposed contiguous relationship with electrically conductive material, such as in the form of a foil 8. The dimensions of the film 6 are such that it lies flat within cavity 4 and substantially abuts the sidewalls 10 thereof. The dimensions of the foil 8 are such that its edges are slightly spaced from the sidewalls 10 to avoid buckling of the foil upon later heating of and attendant expansion of the foil.

The top of the mold cavity 4 is closed with a top plate 12 having a depending portion 14 which forms a sliding fit with the sidewalls 10. The depending portion terminates into shoulders 16 which are spaced from the top of mold 2 when the bottom face of the depending portion 10 is brought into contact with the foil 8.

The mold 2 and top plate 12 are heated, such as by passing a heating medium, e.g. hot oil, through interior passages 18, to a temperature at which the film sticks to the foil, which temperature can be called the wetting temperature of the film for the foil. Preferably, the temperature across the surface of the foil 8 has a uniformity within 3° C. per linear inch of foil surface. During this heating, pressure is applied to the brought together film and foil by the top plate 12 or by pressure means, such as a ram of a press (not shown) acting through the top plate in the direction indicated by the arrow.

Sufficient pressure is applied to insure intimate contact between the film and foil so that lamination or adherence by the film wetting the foil can occur. Thus, the pressure should prevent shrinking or buckling of the film resulting from the relief of stresses present in the film from its manufacture and additional buckling or curling of the film resulting from expansion during further heating. Generally, pressures of from 10 to 50 p.s.i.g. applied through top plate 12 are sufficient.

During the heating and pressure application, sidewalls 10 of the cavity 4 laterally confine the film 6 from both lateral expansion and lateral flow at wetting temperatures. The film must expand with the heating, however, but this expansion is limited by the sidewalls 10 and pressure application to a uniform volume expansion in a direction along the sidewalls. This expansion causes a partial retraction of the top plate 12 from cavity 4, with the partially retracted position being represented by dashed lines 20 in FIG. 1. If the top plate is not allowed to retract during heating, the resulting pressure upon the brought together film and foil may be excessive resulting in distortion of the foil, such distortion including "swimming" of separate elements formed from electrically conductive material. Thus, the maximum pressure can be described as that which does not cause distortion of the foil. If pressure is applied by external means, such pressure may therefore have to be partially relieved during heating.

Upon wetting of the film onto the foil under intimate contacting conditions, a laminate is formed in the sense that the film, when cooled, will be strongly adherent to the foil. The laminate is now cooled. During this cooling, the film 6 of the laminate tends to shrink much more than the foil. Such differential shrinkage and the residual stresses created in the film thereby, is avoided by maintaining the laminate under pressure in the same manner as in the heating step, only the pressure criteria now is generally to apply sufficient pressure to prevent lateral shrinkage of the film, except such shrinkage as will enable the laminate to be removed from the mold cavity 4. Initially, this application of pressure would cause the film 6 of the laminate to flow sideways. This again is prevented by laterally confining the laminate (at least the film component thereof) via sidewalls 10 of cavity 4 during cooling.

This cooling step of the process of the present invention is most conveniently carried out by passing cold water through interior passsages 18 of the mold 2 and top plate 12 shown in FIG. 1, in which case the top plate reenters the mold cavity 4 as the film 6 shrinks. Accompanying this re-entry, pressure can be increased to prevent lateral shrinkage, but not so high as to distort the foil 8. In general, the pressure and lateral confinement conditions of the cooling step can also be described as applying pressure together with lateral confinement of the laminate to prevent differential shrinkage of the film and foil. The resultant cooled laminate is removed from the mold and is dimensionally stable.

This laminate can be treated generally according to conventional procedures, such as by covering selected proportions of the foil 8 with acid resist, acid-etching away the non-resist covered portions of the foil, and removing the resist, to form a printed circuit. This printed circuit can be subjected to further lamination procedures without dimensional unstability.

One of such lamination procedures is shown in FIG. 2, in which printed circuit 30, which is a laminate consisting of film 6 and foil 8 having selectively etched apertures 32 and 34 therein, is placed in the cavity of a mold 36 which corresponds to the cavity 4 of mold 2 of FIG. 1. A cover-coating film 38 of dielectric thermoplastic polymer is stacked on top of the apertured foil 8, and the top of the mold cavity is closed with a top plate 40 corresponding to top plate 12 of FIG. 1. The contents of the mold cavity are then heated, wherein top plate 40 retracts to dashed line 42, and cooled under the same conditions as previously described herein with reference to FIG. 1, and substantially the same results are obtained, except that films 6 and 38 have flowed into and filled apertures 32 and 34 of foil 8 to form the laminate 44 depicted in FIG. 3.

Another laminating procedure which can be carried out with the printed circuit 30 is to laminate it and other printed circuits one to the other. Printed circuit 30 is placed in a cavity of a mold 50 which corresponds to the cavity 4 of mold 2 of FIG. 1. Stacked on top of the printed circuit, film-to-apertured foil, are printed circuits 52, 54, 56, and 58, consisting of film 60 and foil 62, film 64 and foil 66, film 68 and foil 70, and film 72 and foil 74, respectively. The film and foil of the printed circuits 52, 54, 56, and 58 have been laminated to one another in the same way as film 6 and foil 8.

Foils 66 and 70 each have an aperture 76 which is about the same size as aperture 32 of foil 8. Foils 62 and 74 each have an aperture 80 which is smaller in size than apertures 32 and 76. In the practice of laminating printed circuits together, it is sometimes desirable to electrically interconnect selected circuits of the stack of circuits together by passing an electrical conductor element (not shown) through registering apertures in the printed circuits of the stack. Electrical interconnection of some of the circuits in the stack is avoided by making their registering aperture oversize so as to remain out of contact with the conductor element. Because of dimensional variations between circuits, it has heretofore been necessary to make these oversize apertures excessively oversize, which detracts from the otherwise usable area in the printed circuit.

In the present invention, the size differential between apertures 76 and 32 and apertures 80 can be minimized, because their centers lie on a common center-line 82. The top plate 84, corresponding to top plate 12 of FIG. 1, is placed over the mold cavity, and the mold 50 is heated, whereby top plate 84 retracts to dashed line 86, and cooled under the same conditions as previously described herein with reference to FIG. 1 and substantially the same results are obtained, except that the apertures become filled with thermoplastic polymer as in the case of FIG. 3. The precision alignment of apertures 32, 76, and 80 is maintained during this lamination of printed circuits 30, 52, 54, 56, and 58 together, whereby apertures 80 of foils 62 and 74 can be interconnected by the procedure hereinbefore described without the conductor element coming into contact with foils 8, 66, and 70.

The process of the present invention can also be carried out continuously in equipment such as shown in FIG. 5. In this figure, two pairs of rolls 90 and 92 and 94 and 96 are positioned to form nips. Each of the rolls has a circumferential groove 98. Trained around the grooves 98 in rolls 90 and 94 and rolls 92 and 96 are stainless steel belts 100 and 102, respectively. Continuous films 104 and 106 of dielectric thermoplastic polymer material are passed from storage rolls 108, into the grooves 98 of rolls 90 and 92, respectively, and into the nip formed by these rolls and belts 100 and 102. Also entering the nip via a centering device 109 is a series of metallic conductors 110, only one of which is shown.

The arrangement of elements just prior to entering the nip between rolls 90 and 92 is best shown in FIG. 6. Positioned against these rolls in grooves 98 are belts 100 and 102 and positioned against these belts are films 104 and 106, respectively. Between the films 104 and 106 lie the centered conductors 110 which can be of any cross-sectional shape desired.

The films 104 and 106 are heated by hot air jets 112 and electrical heating elements 113 to a wetting temperature as the films enter the nip. In the nip, the rolls 90 and 92 acting through belts 100 and 102 press the films into intimate contact with the conductors 110, thereby enveloping the conductors to form the laminate 120 shown in FIG. 7. The pressure applied by the rolls 90 and 92 is controlled by having them spring-biased towards one another in a manner to be overcome by excessive laminating pressure. During heating and pressure application, the sides 114 of the grooves 98 laterally confine the films so that their expansion and flow is directed at and around the conductors 110. This lateral confinement prevents "swimming" or sideways drift of the conductors, which could cause short circuiting in use.

The laminate 120 is cooled by passing the belts 100 and 102 beneath cooling shoes 122 immediately after leaving the nip between rolls 90 and 92 as shown in FIG. 5. These shoes have interior passages 124 (FIG. 7)

and inlets 126 and outlets 128 for flowing cooling water through the passages 124. The belts 100 and 102 are cooled by contact with cooling shoes 122 and the laminate 120 is cooled by contact with the cooled belts 100 and 102. Following cooling, the laminate 120 passes between the nip of rolls 94 and 96 and on to windup or other operations.

Pressure is maintained against the laminate 120 during cooling by having the cooling shoes 122 suitably spring-loaded (not shown) against the belts 100 and 102. Lateral confinement of the laminate during this cooling and application of pressure is obtained by fixed sidebars 130 spaced apart the same distance as sides 114 of grooves 98 and extending as close to the nip as possible. The resultant laminate 120 is dimensionally stable, free of curl, and the conductors 110 embedded therein exhibit the alignment imparted by centering device 109.

This continuous process can also be applied to laminating electrically conductive material in the form of foil to dielectric thermoplastic polymer film. Apparatus for carrying such a process is shown in FIG. 8 and is essentially the same as the apparatus shown in FIG. 5. In FIG. 8, a continuous film 140 of dielectric thermoplastic polymer is fed from one storage roll 108 and a continuous metallic foil 142 is fed from the other storage roll 108, both into their respective grooves 98 and through the nip between rolls 90 and 92. To illustrate another form of heating the film to its wetting temperature, an infrared heater 144 is used to heat the exterior surface of the film and foil instead of hot air jets 112 of FIG. 5. Pressure and lateral confinement during laminating and cooling is applied to the film and foil in the same manner as herein described with respect to the films and conductors in FIGS. 5 to 7. The resultant laminate 146 is shown in cross-section in FIG. 9. This laminate is dimensionally stable and, after cutting into the desired lengths, can be further treated in the manner of the laminate obtained in the apparatus of FIG. 1.

Details of an illustrative process of the present invention are as follows: A film of fluorocarbon polymer, namely, a copolymer of tetrafluoroethylene and hexafluoropropylene such as described in U.S. Pat. No. 3,085,083 to Schreyer, measuring 6 x 6 x 0.005 in., is placed in a mold cavity of the same cross section. A copper foil measuring slightly less than 6 x 6 in. and 0.0014 in. thick is stacked on top of the polymer film. A top plate is placed over the mold cavity and the depending portion of the top plate bears against the foil. The mold is placed in a press equipped with a pressure gauge and is then heated to 260° C. ±2° for a sufficient time for the lamination of film to foil to occur. Throughout the heating, the brought together film and foil are maintained at a pressure of 15 p.s.i.g. by the ram of the press. The mold is cooled while maintaining the die plate in place in the press and allowing the pressure to fall off from 15 p.s.i.g. as the die plate re-enters the mold cavity. Heating of the mold is accomplished by electrical heaters inserted within interior passages in the mold and top plate. Cooling is accomplished by removing the electrical heaters and then passing cold water through the passages. The resultant laminate is free of curl even after etching away most of the foil. Upon heating of the laminate, it does not appear to undergo any dimensional changes.

The same results are obtained when a film thickness of 0.122 in. and foil thickness of 0.003 in. is used.

Details illustrating a different way of carrying out the process of this invention are as follows: Apparatus such as shown in FIG. 5 is used, in which the width of the tetrafluoroethylene/hexafluoropropylene copolymer film is 2 in. and the thickness is 0.030 in. The belts 100 and 102 are made of stainless steel 0.020 in. thick. The film and 0.015 in. conductors spaced apart 0.015 in. are passed at the rate of about 20 ft./min. between the nip of circumferentially grooved rolls 90 and 92 heated to 340° C. An infrared heater capable of heating a surface to 400° C. is positioned proximate to rolls 90 and 92 in order to heat the film prior to the nip, and jets of air heated to about 430° C. contact the film and conductor as they enter the nip of the rolls 90 and 92. The length of the cooling shoes is about 12 in. The resultant laminate is dimensionally stable.

Suitable thermoplastic polymer materials for use in the process of this invention include any of those which have sufficient dielectric strength for a particular end-use and which can be laminated to an electrically conductive matreial. Examples of such materials include the saturated hydrocarbon polymers such as polyethylene, linear or branched, polypropylene, and copolymers thereof; fluorocarbon polymers such as polychlorotrifluoroethylene and melt fabricable polytetrafluoroethylene, i.e. polytetrafluoroethylene containing a minor proportion of an additive for the purpose of enabling the polymer to be fabricated from a melt, such as tetrafluoroethylene/hexafluoropropylene copolymer and tetrafluoroethylene/perfluorovinyl ether as disclosed in U.S. Pat. No. 3,159,609 to Harris et al., and polyvinyl chloride.

Suitable electrically conductive materials include any of those materials used for this purpose and which are laminable to dielectric thermoplastic polymer materials at a wetting temperature. Copper and silver are examples of suitable electrically conductive materials. The material can be in the form of a strip, wire, foil, or the like and can be surface treated, such as to have a coating of CuO and/or $Cu_2O$, to promote adhesion with the polymer material. The electrically conductive material can also be in the form of an electrochemically deposited pattern.

The wetting temperature and pressure under which laminating and cooling is carried out will depend on the particular materials being employed. In the case of tetrafluoroethylene/hexafluoropropylene copolymer, preferably containing from 15 to 20 mole percent of hexafluoropropylene derived units, and copper foil or wire, a wetting temperature of 250–270° C. and pressure of 10 to 50 p.s.i. are useful.

As many apparently widely different embodiments of this invention may be made without departing from the spirit and scope thereof, it is to be understood that this invention is not limited to the specific embodiments thereof.

What is claimed is:

1. A process for making a dimensionally stable laminate of dielectric thermoplastic polymer film and electrically conductive material in the form of strip, wire, foil, or electrochemically deposited pattern, comprising bringing said film and conductive material together in superimposed relationship in a mold cavity wherein the edge of said film substantially abuts the walls of said mold cavity and said conductive material is spaced from said walls, heating the superimposed film and conductive material to a temperature at which the film wets the conductive material, applying pressure to the film to force it into intimate contact with the conductive material during said heating, the walls of said mold cavity laterally confining the film during the pressure application step, but permitting the film to expand in the transverse direction, the conductive material being free of lateral confinement, cooling the resultant laminate while maintaining lateral confinement of said film, and maintaining said laminate under pressure during said cooling so as to prevent differential shrinkage of said film and said conductive material.

2. The process of claim 1 wherein said film is a fluorocarbon polymer, saturated hydrocarbon polymer, or polyvinyl chloride.

3. The process of claim 2 wherein said fluorocarbon polymer is melt fabricable tetrafluoroethylene polymer.

4. The process of claim 3 wherein said melt-fabricable tetrafluoroethylene polymer is a copolymer of tetrafluoroethylene and hexafluoropropylene.

5. The process of claim 1 wherein said conductive material is metal foil.

6. The process of claim 5 including the additional step, after cooling, of selectively removing portions of said metal foil to form a printed circuit.

7. The process of claim 1 wherein said conductive material is a plurality of laterally spaced wires.

8. The process of claim 1 wherein said conductive material is already laminated to another said film, whereby said first mentioned film is a cover-coating for said conductive material.

9. The process of claim 1 wherein said film and said conductive material are already laminated to other conductive material and film, respectively, whereby said resultant laminate is a stack of alternating layers of conductive material and film.

10. The process of claim 1 wherein said film and said conductive material are each strips and said strips are brought together at the nip between a pair of convergently moving surfaces to obtain the application of said pressure during heating, with at least one of said surfaces having a groove running in the direction of movement thereof for receiving said film and obtaining said lateral confinement during heating.

11. The process of claim 10, wherein said conductive material is wires, the other of said surfaces has a groove in register with the groove in said one surface, another said film is received in the groove in said other surface for obtaining lateral confinement during heating, and said wires are positioned between the film in each said groove at said nip so as to be enveloped by said film.

12. The process of claim 1 wherein the pressure of the applying step is from 10 to 50 p.s.i.g.

References Cited

UNITED STATES PATENTS

| | | | |
|---|---|---|---|
| 2,520,737 | 8/1950 | Romeyn et al. | 156—306 XR |
| 2,833,686 | 5/1958 | Sandt | 156—311 XR |
| 2,964,436 | 12/1960 | Mikulis et al. | 156—3 |
| 3,029,178 | 4/1962 | Carver | 156—359 |
| 3,107,197 | 10/1963 | Stein et al. | 156—3 XR |
| 3,258,387 | 6/1966 | Brown et al. | 156—242 XR |
| 3,305,416 | 2/1967 | Kahan et al. | 156—3 |
| 3,013,913 | 12/1961 | Croop et al. | 264—255 XR |

JOHN T. GOOLKASIAN, Primary Examiner

D. J. FRITSCH, Assistant Examiner

U.S. Cl. X.R.

156—243, 309, 311, 324; 264—104, 248